US010739186B2

(12) United States Patent
Hatcher et al.

(10) Patent No.: US 10,739,186 B2
(45) Date of Patent: Aug. 11, 2020

(54) BI-DIRECTIONAL WEIGHT CELL

(71) Applicant: Samsung Electronics Co., Ltd., Suwon-si, Gyeonggi-do (KR)

(72) Inventors: Ryan M. Hatcher, Austin, TX (US); Jorge A. Kittl, Austin, TX (US); Borna J. Obradovic, Leander, TX (US); Titash Rakshit, Austin, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 324 days.

(21) Appl. No.: 15/886,753

(22) Filed: Feb. 1, 2018

(65) Prior Publication Data

US 2019/0154493 A1     May 23, 2019

Related U.S. Application Data

(60) Provisional application No. 62/588,874, filed on Nov. 20, 2017.

(51) Int. Cl.
*G11C 7/10* (2006.01)
*G11C 13/00* (2006.01)
*G01G 23/38* (2006.01)
*G06G 7/16* (2006.01)
*G11C 11/54* (2006.01)
(Continued)

(52) U.S. Cl.
CPC .............. *G01G 23/38* (2013.01); *G06G 7/16* (2013.01); *G06N 3/063* (2013.01); *G11C 7/1006* (2013.01); *G11C 11/1659* (2013.01); *G11C 11/54* (2013.01); *G11C 13/0002* (2013.01)

(58) Field of Classification Search
CPC ....... G11C 13/004; G11C 13/02; G11C 11/21; G11C 13/0023; G11C 13/003; G11C 11/00; G11C 7/1006; G11C 7/12; G11C 7/18; G11C 7/10; G06G 7/16; G01G 23/38
See application file for complete search history.

(56) References Cited

U.S. PATENT DOCUMENTS 9,152,827 B2    10/2015  Linderman et al.
9,489,618 B2    11/2016  Roy et al.
10,381,071 B1 *  8/2019  Si ........................... G11C 11/412
(Continued)

FOREIGN PATENT DOCUMENTS

WO    WO 2017/146706 A1    8/2017

*Primary Examiner* — Hien N Nguyen
(74) *Attorney, Agent, or Firm* — Lewis Roca Rothgerber Christie LLP

(57) ABSTRACT

A weight cell including first and second bi-directional memory elements each configured to switch between a first resistance state and a second resistance state different than the first resistance state. A first input line is connected to a first terminal of the first bi-directional memory element, and a second input line is connected to the first terminal of the second bi-directional memory element. A first diode in forward bias connects the second terminal of the first bi-directional memory element to a first output line, a second diode in reverse bias connects the second terminal of the second bi-directional memory element to a second output line, a third diode in reverse bias connects the second terminal of the first bi-directional memory element to the second output line, and a fourth diode in forward bias connects the second terminal of the second bi-directional memory element to the first output line.

20 Claims, 5 Drawing Sheets

(51) Int. Cl.
*G06N 3/063* (2006.01)
*G11C 11/16* (2006.01)

(56) References Cited

U.S. PATENT DOCUMENTS

| | | | |
|---|---|---|---|
| 2013/0135008 A1* | 5/2013 | Zhang | H03K 19/17748 |
| | | | 326/41 |
| 2016/0336064 A1 | 11/2016 | Seo et al. | |
| 2017/0270403 A1 | 9/2017 | Zhang | |
| 2018/0121106 A1* | 5/2018 | Kim | G06F 3/0679 |
| 2019/0258581 A1* | 8/2019 | Lee | G06F 3/068 |

* cited by examiner

BI-DIRECTIONAL WEIGHT CELL

CROSS-REFERENCE TO RELATED APPLICATION(S)

The present application claims priority to and the benefit of U.S. Provisional Application No. 62/588,874, filed Nov. 20, 2017, the entire contents of which are incorporated herein by reference.

BACKGROUND

The performance of a variety of different applications is controlled by multiply and accumulate (MAC) operations. For instance, the performance of neuromorphic computing and machine learning applications is determined by the efficiency with which MAC operations are performed. Accordingly, several different hardware solutions have been explored and developed to increase the efficiency with which MAC operations are performed.

Graphics processing units (GPUs) are commonly utilized to perform MAC operations because the highly parallelized architecture of GPUs offers developers the ability to perform many multiplications in parallel. Accordingly, GPUs are generally capable of outperforming central processing units (CPUs) at performing MAC operations.

Recently, dedicated digital neuromorphic ASICs (e.g., tensor processing units (TPUs)) have been developed that are capable of outperforming GPUs because the architecture of these dedicated digital neuromorphic ASICs have been optimized for MAC operations. Additionally, neuromorphic applications can commonly tolerate lower precision (e.g., 8-bit or lower) than is typically required from GPUs, and therefore neuromorphic ASICs may achieve increased performance compared to GPUs by performing reduced precision multiplication operations.

However, performing MAC operations digitally is relatively expensive compared to analog implementations, particularly when the MAC operation is a vector multiplied by a matrix, as in the case of neural networks.

Additionally, for applications that require large neural nets, there can be a substantial latency and power penalty incurred when transferring the weights to and from memory due to memory bottleneck. These memory bottlenecks that lead to expensive transfers of weights may be reduced by increasing the cache/memory on-board.

SUMMARY

The present disclosure is directed to various embodiments of a weight cell. In one embodiment, the weight cell includes first and second bi-directional memory elements each configured to switch between a first resistance state and a second resistance state different than the first resistance state. The weight cell also includes a first input line connected to a first terminal of the first bi-directional memory element, and a second input line connected to the first terminal of the second bi-directional memory element. The weight cell also includes a first diode in forward bias connecting the second terminal of the first bi-directional memory element to a first output line, a second diode in reverse bias connecting the second terminal of the second bi-directional memory element to a second output line, a third diode in reverse bias connecting the second terminal of the first bi-directional memory element to the second output line, and a fourth diode in forward bias connecting the second terminal of the second bi-directional memory element to the first output line.

Each of the first and second bi-directional memory elements may be a magnetic tunnel junction (MTJ) including a pinned layer and a free layer.

The MTJ of each of the first and second bi-directional memory elements may have perpendicular magneto anisotropy.

The first and second bi-directional memory elements may be located in a same layer of the bi-directional weight cell, and magnetizations of the pinned layers of the first and second bi-directional memory elements may be oriented either up or down.

The MTJ of each of the first and second bi-directional memory elements may have in-plane magneto anisotropy.

The first and second bi-directional memory elements may be located in a same layer of the bi-directional weight cell, and magnetizations of the pinned layers of the first and second bi-directional memory elements may be oriented parallel to each other.

The MTJ of the first bi-directional memory element and the MTJ of the second bi-directional memory element may be in different layers of the weight cell.

Each of the first, second, third, and fourth diodes may include a tantalum layer, a tantalum nitride layer on the tantalum layer, and a tantalum oxy nitride layer on the tantalum nitride layer.

A ratio of resistance in reverse bias to resistance in forward bias of at least one of the first, second, third, and fourth diodes is approximately $10^6$.

The present disclosure is also directed to an integrated circuit including a series of weight cells arranged in a crossbar array having a series of columns and a series of rows, The cell also includes a pair of input lines a first input line and a second input line for each of the rows, a pair of output lines a first output line and a second output line for each of the columns. Each of the weight cells includes a first bi-directional memory element including a first terminal and a second terminal. The first bi-directional memory element is configured to switch between a first resistance state and a second resistance state different than the first resistance state. The second bi-directional memory element includes a first terminal and a second terminal. The second bi-directional memory element is configured to switch between the first resistance state and the second resistance state. The cell also includes a first diode connecting the second terminal to the first output line of the respective pair of output lines, a second diode connecting the second terminal of the second bi-directional memory element to the second output line of the respective pair of output lines, a third diode connecting the second terminal of the first bi-directional memory element to the second output line, and a fourth diode connecting the second terminal of the second bi-directional memory element to the first output line. The first diode is oriented in forward bias from the first bi-directional memory element to the first output line, the second diode is oriented in reverse bias from the second bi-directional memory element to the second output line, the third diode is oriented in reverse bias from the first bi-directional memory element to the second output line, and the fourth diode is oriented in forward bias from the second bi-directional memory element to the first output line.

The present disclosure is also directed to a method of performing multiply and accumulate operations utilizing the integrated circuit. In one embodiment, the method includes performing a read operation by supplying a vector of inputs to each pair of input lines, holding each pair of output lines at ground, and calculating a product of the vector of inputs and a matrix of values, wherein the matrix of values are encoded by resistance states of the first and second bi-directional weight elements of each of the weight cells. Supplying the vector of inputs may include supplying time-encoded pulses of fixed potentials having opposite signs to the first and second input lines for each pair of input lines, or supplying potential-encoded values to the first and second input lines for each pair of input lines.

The method may also include performing a write operation to program the first and second bi-directional memory elements of each of the weight cells into a high resistance state or a low resistance state. Performing the write operation may include programming the first and second bi-directional memory elements of each of the weight cells in the first column into the high resistance state or the low resistance state, and subsequently programming the first and second bi-directional memory elements of each of the weight cells in the second column into the high resistance state or the low resistance state. Programming the first and second bi-directional memory elements of each of the weight cells in the first column may include disabling writing to the first and second bi-directional memory elements of each of the weight cells in the second column by setting the pair of output lines for the second column in reverse bias. Programming the first and second bi-directional elements of each of the weight cells in the first column may further include programming a portion of the first and second bi-directional memory elements of the weight cells in the first column by flowing current in a first direction from the input lines to the output lines, and programming a remaining portion of the first and second bi-directional memory elements of the weight cells in the first column by flowing current in a second direction from the output lines to the input lines.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

These and other features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

DETAILED DESCRIPTION

Figure 1A:
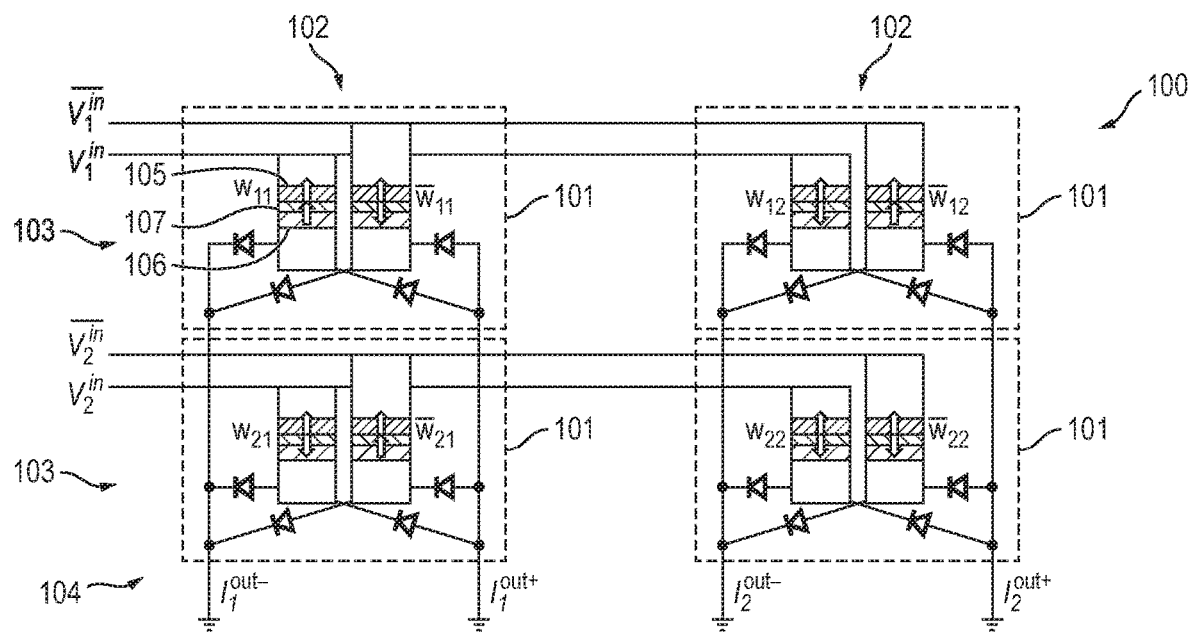
FIG. 1A is a schematic layout view of a cell according to one embodiment of the present disclosure including a series of weight cells arranged in an array.

The present disclosure is directed to various embodiments of a weight cell configured to perform multiply and accumulate (MAC) operations. In one or more embodiments, the weight cell of the present disclosure may be utilized to perform MAC operations in neuromorphic computing or machine learning applications.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

With reference now to FIG. 1A, an integrated circuit 100 according to one embodiment of the present disclosure includes a series of weight cells 101 arranged in a series of columns 102 and a series of rows 103 forming a crossbar array 104. In the illustrated embodiment, the integrated circuit 100 includes two input lines $V_i^{in}$, $\overline{V_i^{in}}$ (i.e., a first input line $V_i^{in}$ and a second input line $\overline{V_i^{in}}$) for each of the rows 103 of the crossbar array 104, where the subscript i indicates the row 103 of the crossbar array 104. For each row 103 of the crossbar array 104, the first and second input lines $V_i^{in}$, $\overline{V_i^{in}}$ are connected to each of the weight cells 101 in that row 103 (e.g., the first and second input wires $V_1^{in}$, $\overline{V_1^{in}}$ are connected to the weight cells 101 in the first row 103, and the first and second input wires $V_2^{in}$, $\overline{V_2^{in}}$ are connected to the weight cells 101 in the second row 103). Additionally, in the illustrated embodiment, the integrated circuit 100 includes two output lines $I_j^{out-}$, $I_j^{out+}$ for each of the columns 102 of the crossbar array 104, where the subscript j indicates the column 102 of the crossbar array 104. For each column 102, the first and second output lines $I_j^{out-}$, $I_j^{out+}$ are connected to each of the weight cells 101 in that column 102 (e.g., the first and second output lines $I_1^{out-}$, $I_1^{out+}$ are connected to the weight cells 101 in the first column 102, and the first and second output lines $I_2^{out-}$, $I_2^{out+}$ are connected to the weight cells 101 in the second column 102). Additionally, during a read operation, described in more detail below, the first and second output lines $I_j^{out-}$, $I_j^{out+}$ of each column 102 are connected to ground.

In the illustrated embodiment, each weight cell 101 in the crossbar array 104 includes two bi-directional memory elements $w_{i,j}$, $\overline{w}_{i,j}$ (i.e., a first bi-directional memory element $w_{i,j}$ and a second bi-directional memory element $\overline{w}_{i,j}$), where the subscript i refers to the row 103 in which the bi-directional memory element is located, and the subscript j refers to the column 102 in which the bi-directional memory element is located. In one or more embodiments, each of the bi-directional memory elements $w_{i,j}$, $\overline{w}_{i,j}$ of the weight cells 101 may be a spin-transfer torque magnetic tunnel junction (STT-MTJ). In one or more embodiments in which the bi-directional memory elements $w_{i,j}$, $\overline{w}_{i,j}$ of the weight cells 101 are MTJs, the bi-directional memory elements $w_{i,j}$, $\overline{w}_{i,j}$ each include a pinned layer 105, a free layer 106, and a spacer 107 (e.g., an insulating layer) between the pinned layer 105 and the free layer 107.

Each of the bi-directional memory elements $w_{i,j}$, $\overline{w}_{i,j}$ is configured to exhibit two states, a high resistance state and a low resistance state. The states of the bi-directional memory elements $w_{i,j}$, $\overline{w}_{i,j}$ are configured to be programmed based on the direction in which a programming current flows through the bi-directional memory element $w_{i,j}$, $\overline{w}_{i,j}$. For instance, in one or more embodiments, the bi-directional memory elements $w_{i,j}$, $\overline{w}_{i,j}$ are configured to be programmed into a low resistance state by current flowing through the bi-directional memory elements $w_{i,j}$, $\overline{w}_{i,j}$ in a first direction (e.g., from the input lines $V_i^{in}$, $\overline{V_i^{in}}$ to the output lines $I_j^{out-}$, $I_j^{out+}$), and the bi-directional memory elements $w_{i,j}$, $\overline{w}_{i,j}$ are configured to be programmed into the high resistance state by current flowing through the bi-directional memory elements $w_{i,j}$, $\overline{w}_{i,j}$ in a second direction opposite the first direction (e.g., from the output lines $I_j^{out-}$, $I_j^{out+}$ to the input lines $V_i^{in}$, $\overline{V_i^{in}}$). In one or more embodiments, the resistance in the high resistance state may be from approximately 2 times to approximately 3 times larger than the resistance in the low resistance state (e.g., the bi-directional memory elements $w_{i,j}$, $\overline{w}_{i,j}$ exhibit a tunnel magnetoresistance (TMR) of approximately 150% to approximately 200%). In one or more embodiments in which the bi-directional memory elements $w_{i,j}$, $\overline{w}_{i,j}$ are MTJs, the bi-directional memory elements $w_{i,j}$, $\overline{w}_{i,j}$ exhibit a low resistance state when the magnetization of the free layer 106 is parallel to the magnetization of the pinned layer 105. Additionally, in one or more embodiments in which the bi-directional memory elements $w_{i,j}$, $\overline{w}_{i,j}$ are MTJs, the bi-directional memory elements $w_{i,j}$, $\overline{w}_{i,j}$ exhibit a high resistance state when the magnetization of the free layer 106 is anti-parallel to the magnetization of the pinned layer 105. In one or more embodiments in which the bi-directional memory elements $w_{i,j}$, $\overline{w}_{i,j}$ are MTJs, the MTJ memory elements $w_{i,j}$, $\overline{w}_{i,j}$ may have perpendicular magneto anisotropy (PMA) or in-plane magneto anisotropy (IPMA).

Figure 1B:
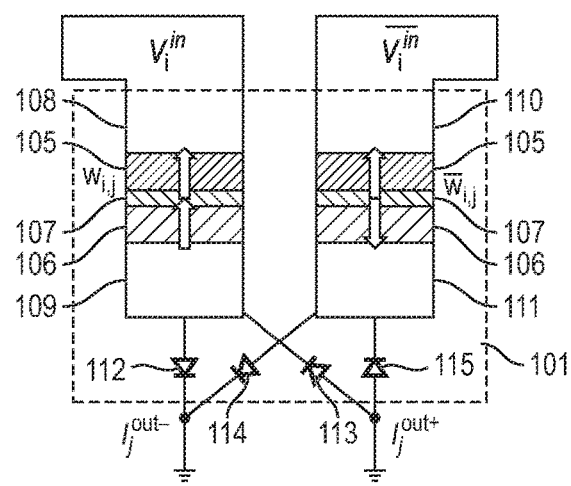
FIG. 1B is a schematic view of one of the weight cells illustrated in FIG. 1A in which a first memory element is in a low resistance state and a second memory element is in a high resistance state.
Figure 1C:
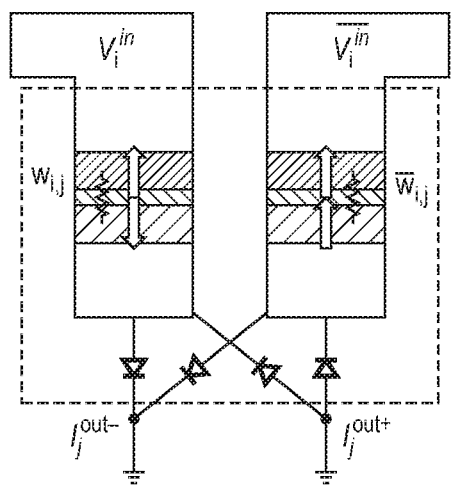
FIG. 1C is a schematic view of one of the weight cells illustrated in FIG. 1A in which the first memory element is in a high resistance state and the second memory element is in a low resistance state.

With reference now to FIGS. 1B-1C, each of the bi-directional memory elements $w_{i,j}$, $\overline{w}_{i,j}$ includes two terminals 108, 109 and 110, 111, respectively (e.g., each of the bi-directional memory elements $w_{i,j}$, $\overline{w}_{i,j}$ includes an input terminal 108, 110, respectively, and an output terminal 109, 111, respectively). As illustrated in FIGS. 1B-1C, for each of the weight cells 101, the first input line $V_i^{in}$ is connected to the input terminal 108 of the first bi-directional memory element $w_{i,j}$ and the second input line $\overline{V_i^{in}}$ is connected to the input terminal 110 of the second bi-directional memory element $\overline{w}_{i,j}$.

In the illustrated embodiment, for each of the weight cells 101, the output terminal 109 of the first bi-directional memory element $w_{i,j}$ is connected to the first output line $I_j^{out-}$ by a first diode 112 and to the second output line $I_j^{out+}$ by a second diode 113. In the illustrated embodiment, the first diode 112 connecting output terminal 109 of the first bi-directional memory element $w_{i,j}$ to the first output line $I_j^{out-}$ is oriented in forward bias from the first bi-directional memory element $w_{i,j}$ to the first output line $I_j^{out-}$, and the second diode 113 connecting output terminal 109 of the first bi-directional memory element $w_{i,j}$ to the second output line $I_j^{out+}$ is oriented in reverse bias from the first bi-directional memory element $w_{i,j}$ to the second output line $I_j^{out+}$.

Additionally, in the illustrated embodiment, for each of the weight cells 101, the output terminal 111 of the second bi-directional memory element $\overline{w}_{i,j}$ is connected to the first output line $I_j^{out-}$ by a third diode 114 and to the second output line $I_j^{out+}$ by a fourth diode 115. In the illustrated embodiment, the third diode 114 connecting output terminal 111 of the second bi-directional memory element $\overline{w}_{i,j}$ to the first output line $I_j^{out-}$ is oriented in forward bias from the second bi-directional memory element $\overline{w}_{i,j}$ to the first output line $I_j^{out-}$, and the fourth diode 115 connecting output terminal 111 of the second bi-directional memory element $\overline{w}_{i,j}$ to the second output line $I_j^{out+}$ is oriented in reverse bias from the second bi-directional memory element $\overline{w}_{i,j}$ to the second output line $I_j^{out+}$.

Figure 2:
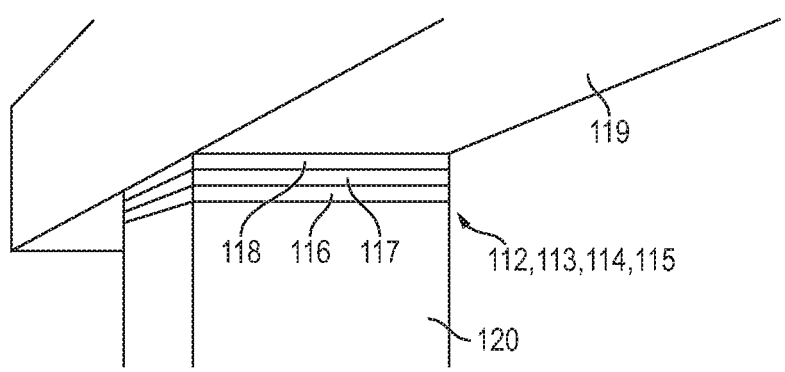
FIG. 2 is a schematic view of a diode according to one embodiment of the present disclosure.

FIG. 2 depicts one of the diodes 112, 113, 114, 115 according to one embodiment of the present disclosure. In the illustrated embodiment, each of the diodes 112, 113, 114, 115 may include a tantalum (Ta) layer 116, a tantalum nitride (TaN) layer 117 on the Ta layer 116, and tantalum oxy nitride (Ta—ON) layer 118 on the TaN layer 117. In the illustrated embodiment, the TaON layer 118 is connected to a metal layer 119 and the Ta layer 116 is connected to a via 120. In one or more embodiments, the resistance of the forward bias diodes 112, 114 (e.g., the first and third diodes) is approximately 10 kΩ at 1V and the resistance of the reverse bias diodes 113, 115 (e.g., the second and fourth diodes) is approximately 10 GΩ at 1V. In one embodiment, the ratio of resistance in reverse bias to the resistance in forward bias of the diodes 112, 113, 114, 115 may be approximately $10^6$. In one or more embodiments, the diodes 112, 113, 114, 115 may be manufactured by a damascene process. The diodes 112, 113, 114, 115 are configured to eliminate or at least reduce sneak paths and/or leakage during write operations to program the states (e.g., the high resistance states and the low resistance states) of the bi-directional memory elements $w_{i,j}$, $\overline{w}_{i,j}$, as described in detail below.

During a vector-matrix multiplication read operation, the output lines $I_j^{out-}$, $I_j^{out+}$ of the integrated circuit 100 are connected to ground, as illustrated in FIGS. 1A-1C. In one or more embodiments, the vector-matrix multiplication read operation is performed where each value of the input vector is time-encoded by the pulse width of a potential at fixed height but opposite sign on the first and second input lines $V_i^{in}$, $\overline{V_i^{in}}$. The values of the input vector can be positive or negative. In one or more embodiments, the values of the input vector may be encoded by the magnitude of the input potential (e.g., the input vector is potential-encoded). The values of the matrix are encoded by the states of the bi-directional memory elements $w_{i,j}$, $\overline{w}_{i,j}$ in each weight cell 101. Each weight cell 101 can have a positive value, a negative value, or a zero value (or a substantially zero value) depending on the relative states of the two bi-directional memory elements $w_{i,j}$, $\overline{w}_{i,j}$ in the weight cell 101. Multiplication occurs in analog in each weight cell 101 where the total charge passing through the weight cell 101 to the output lines $I_j^{out-}$, $I_j^{out+}$ during a fixed integration period maps to the product of two values. The sum of the charges from all of the weight cells 101 connected to the same output lines output lines $I_j^{out-}$, $I_j^{out+}$ maps to the sum of the products along that column 102 of the crossbar array 104. The total integrated charge over a period of time in each column 102 represents the elements of the output vector of the vector-matrix product of the input values and the array of weights. Accordingly, the multiply and accumulate (MAC) operation is performed in analog where the output is proportional to the sum of the charges collected on the output lines output lines $I_j^{out-}$, $I_j^{out+}$.

FIG. 1B depicts the first bi-directional memory element $w_{i,j}$ in a low resistance state (r) and the second bi-directional memory element $\overline{w}_{i,j}$ in a high resistance state (R) (e.g., for the first bi-directional memory element $w_{i,j}$, the magnetization of the free layer 106 is parallel to the magnetization of the pinned layer 105, and for the second bi-directional memory element $\overline{w}_{i,j}$, the magnetization of the free layer 106 is anti-parallel to the magnetization of the pinned layer 105). FIG. 1C depicts the first bi-directional memory element $w_{i,j}$ in a high resistance state (R) and the second bi-directional memory element $\overline{w}_{i,j}$ in a low resistance state (r) (e.g., for the first bi-directional memory element $w_{i,j}$, the magnetization of the free layer 106 is anti-parallel to the magnetization of the pinned layer 105, and for the second bi-directional memory element $\overline{w}_{i,j}$, the magnetization of the free layer 106 is parallel to the magnetization of the pinned layer 105). Each of the weight cells 101 is configured to function as a XNOR bitcell. Table 1 below is an XNOR truth table showing the total current ($I_{total}$) through the output lines output lines $I_j^{out-}$, $I_j^{out+}$ depending on the states of the bi-directional memory elements $w_{i,j}$, $\overline{w}_{i,j}$ (e.g., a high-resistance state (R) or a low-resistance state (r)) and the sign of the voltages applied to the input lines $V_i^{in}$, $\overline{V_i^{in}}$ (e.g., +V or −V).

TABLE 1

| $w_{i,j}$ | $\overline{w}_{i,j}$ | $V_i^{in}$ | $\overline{V_i^{in}}$ | $I_j^{out+}$ | $I_j^{out-}$ | $I_{total}$ |
|---|---|---|---|---|---|---|
| r | R | +V | −V | $-I_{small}$ | $+I_{big}$ | $+\Delta$ |
| r | R | −V | +V | $-I_{big}$ | $+I_{small}$ | $-\Delta$ |
| R | R | +V | −V | $-I_{big}$ | $+I_{small}$ | $-\Delta$ |
| R | r | −V | +V | $-I_{small}$ | $+I_{big}$ | $+\Delta$ |

Figure 3:
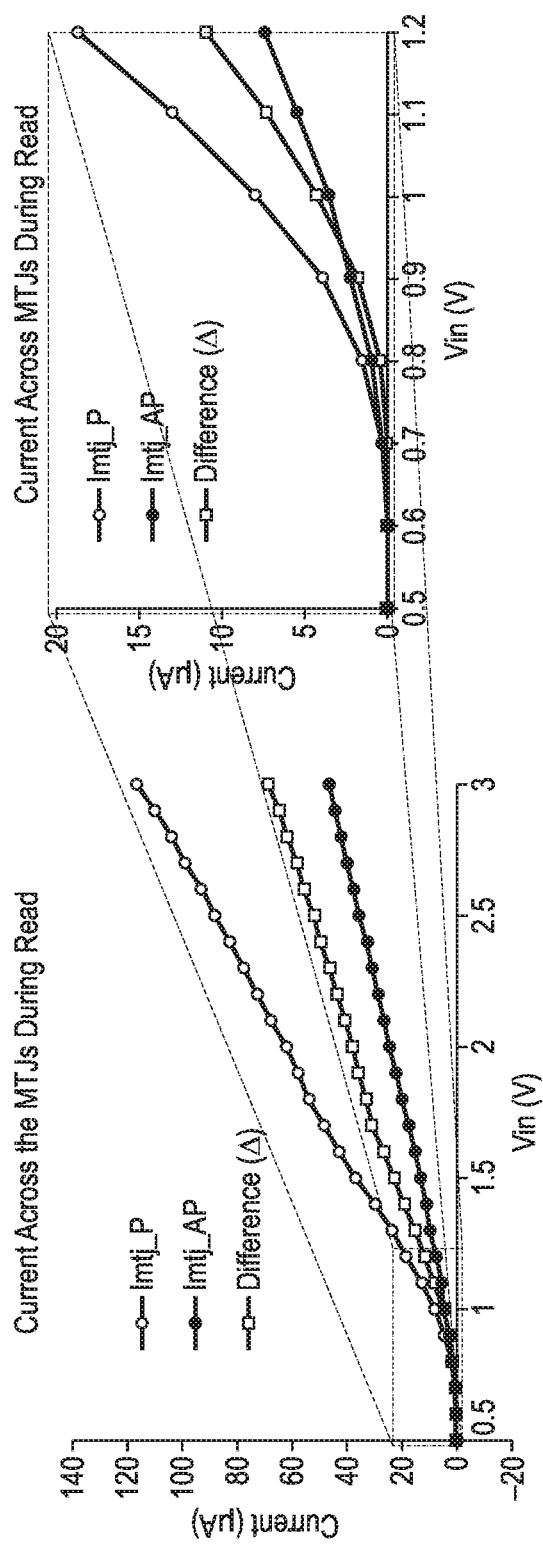
FIG. 3 is a graph depicting the current through the memory elements of the weight cell during a read operation.

FIG. 3 is a graph depicting the current through the bi-directional memory elements $w_{i,j}$, $\overline{w}_{i,j}$ of the weight cell 101 during a MAC read operation.

FIGS. 4A-4D depict write operations to program the states of the bi-directional memory elements $w_{i,j}$, $\overline{w}_{i,j}$ of the weight cells 101 (e.g., write operations to program the bi-directional memory elements $w_{i,j}$, $\overline{w}_{i,j}$ of each of the weight cells 101 into either a high-resistance (R) state or a low-resistance (r) state).

In one or more embodiments, a write operation to set the states of the bi-directional memory elements $w_{i,j}$, $\overline{w}_{i,j}$ of the weight cells 101 (e.g., to set the bi-directional memory elements $w_{i,j}$, $\overline{w}_{i,j}$ to either a high resistance (R) state or a low resistance (r) state) is performed column-by-column (e.g., the states of the bi-directional memory elements $w_{i,1}$, $\overline{w}_{i,1}$ in the first column 102 may be programmed first and then the states of the bi-directional memory elements $w_{i,2}$, $\overline{w}_{i,2}$ in the second column 102 may be subsequently programmed). For instance, in one or more embodiments, the states of the bi-directional memory elements $w_{i,1}$, $\overline{w}_{i,1}$ of the weight cells 101 in the first column 102 may be programmed by first disabling writing for the remaining columns 102 (e.g., the second column 102 and any higher columns of the integrated circuit 100) by placing the output lines connected $I_j^{out-}$, $I_j^{out+}$ to the remaining columns in reverse bias (e.g., setting the first output line $I_2^{out-}$ connected to the second column 102 to $+V_{prog}$ and setting the second output line $I_2^{out+}$ connected to the second column 102 to $-V_{prog}$).

Additionally, as described above, the states of the bi-directional memory elements $w_{i,j}$, $\overline{w}_{i,j}$ are configured to be programmed based on the direction of the current flowing through the bi-directional memory elements $w_{i,j}$, $\overline{w}_{i,j}$. Accordingly, to program the states of the bi-directional memory elements $w_{i,j}$, $\overline{w}_{i,j}$ in a given column (e.g., the bi-directional memory elements $w_{i,1}$, $\overline{w}_{i,1}$ in the first column 102), the bi-directional memory elements that are to be programmed by current flowing in a first direction are programmed first and then the bi-directional memory elements that are to be programmed by current flowing in a second direction opposite the second direction are programmed subsequently. For instance, in the embodiment illustrated in FIG. 4A, the first bi-directional memory element $w_{1,1}$ in the first column 102 and the first row 103 of the crossbar array 104 may be programmed into a low resistance (r) state by setting both of the output lines $I_1^{out-}$, $I_1^{out+}$ in the first column 102 to a low voltage (e.g., $I_1^{out-}=I_1^{out+}=-V_{prog}$) and then setting the input line $V_1^{in}$ connected to the first bi-directional memory element $w_{1,1}$ to a high voltage (e.g., $V_1^{in}=+V_{prog}$) such that current flows in a first direction from the input line $V_1^{in}$ to the output line $I_1^{out-}$ through the first bi-directional memory element $w_{1,1}$.

Figure 4A:
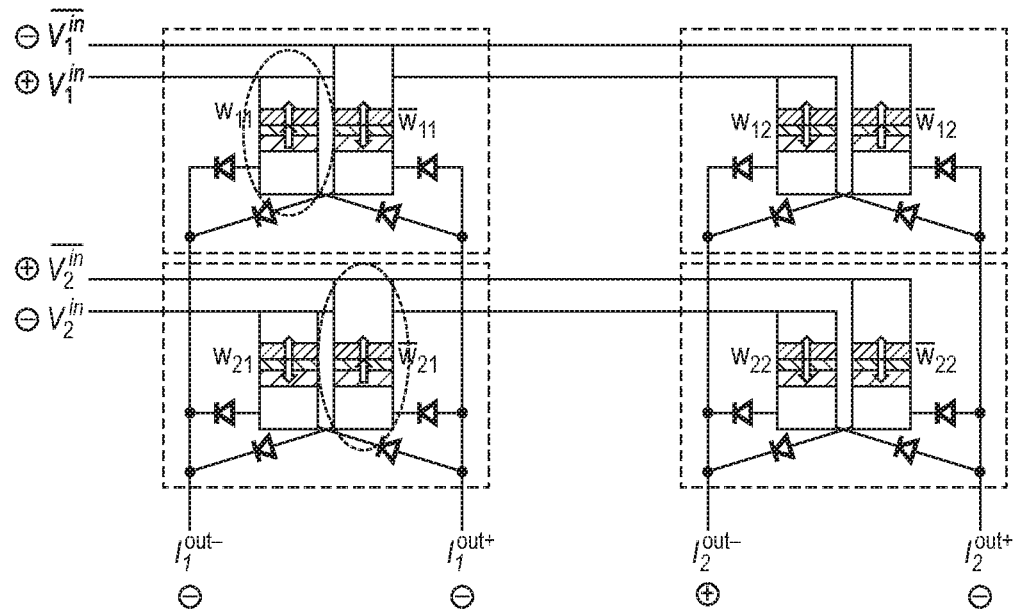
FIGS. 4A-4D are schematic views illustrating tasks of programming the weight cells of the embodiment of the cell illustrated in FIG. 1A.

Additionally, in the embodiment illustrated in FIG. 4A, the second bi-directional memory element $\overline{w}_{2,1}$ in the first column 102 and the second row 103 of the crossbar array 104 may be programmed into a low resistance (r) state by setting both of the output lines $I_1^{out-}$, $I_1^{out+}$ in the first column 102 to a low voltage (e.g., $I_1^{out-}=I_1^{out+}=-V_{prog}$) and then setting the input line $\overline{V_2^{in}}$ connected to the second bi-directional memory element $\overline{w}_{2,1}$ to a high voltage (e.g., $\overline{V_2^{in}}=+V_{prog}$) such that current flows in the first direction from the input line $\overline{V_2^{in}}$ to the output line $I_1^{out-}$ through the second bi-directional memory element $\overline{w}_{2,1}$.

Table 2 below depicts the values of the voltages applied to the input lines $V_i^{in}$, $\overline{V_i^{in}}$ and the output lines $I_j^{out-}$, $I_j^{out+}$ to program the state of bi-directional memory elements $w_{1,1}$, $\overline{w}_{2,1}$ in the first column 102 by flowing current through the bi-directional elements $w_{1,1}$, $\overline{w}_{2,1}$ in a direction from the input lines $V_1^{in}$, $\overline{V_2^{in}}$ to the output line $I_1^{out-}$.

TABLE 2

| Line | Value | Effect |
| --- | --- | --- |
| $V_1^{in}$ | $+V_{prog}$ | Sets bi-directional weight element $w_{1,1}$ to a low resistance state (r) |
| $\overline{V_1^{in}}$ | $-V_{prog}$ | No current across $\overline{w}_{1,1}$ |
| $V_2^{in}$ | $-V_{prog}$ | No current across $w_{2,1}$ |
| $\overline{V_2^{in}}$ | $+V_{prog}$ | Sets bi-directional weight element $\overline{w}_{2,1}$ to a low resistance state (r) |
| $V_1^{out+}$ | $-V_{prog}$ | Disables writing to bi-directional weight elements $w_{i,1}/\overline{w}_{i,1}$ in the first column that will be programmed into a high resistance state by current flowing in the second direction |
| $V_1^{out-}$ | $-V_{prog}$ | Enables writing to bi-directional weight elements $w_{i,1}/\overline{w}_{i,1}$ in the first column that will be programmed into a low resistance state by current flowing in the first direction |
| $V_2^{out+}$ | $-V_{prog}$ | Disables writing to bi-directional weight elements $w_{i,2}/\overline{w}_{i,2}$ in the second column |
| $V_2^{out-}$ | $+V_{prog}$ | Disables writing to bi-directional weight elements $w_{i,2}/\overline{w}_{i,2}$ in the second column |

Figure 4B:
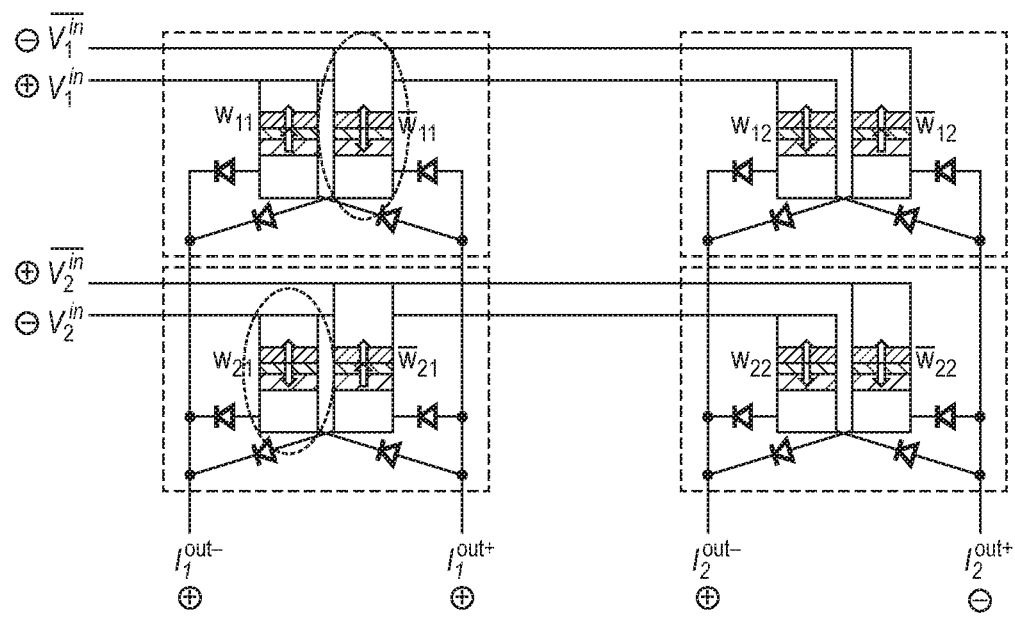

With reference now to the embodiment illustrated in FIG. 4B, the remaining bi-directional memory elements in the first column 102 (e.g., the second bi-directional memory element $\overline{w}_{1,1}$ in the first column 102 and the first row 103 of the crossbar array 104, and the first bi-directional memory element $w_{2,1}$ in the first column 102 and the second row 103 of the crossbar array 104) may be programmed into a high resistance (R) state. For instance, in the illustrated embodiment, the second bi-directional memory element $\overline{w}_{1,1}$ in the first column 102 and the first row 103 of the crossbar array 104 may be programmed into the high resistance (R) state by setting both of the output lines $I_1^{out-}$, $I_1^{out+}$ in the first column 102 to a high voltage (e.g., $I_1^{out-}=I_1^{out+}=+V_{prog}$) and then setting the input line $\overline{V_1^{in}}$ connected to the second bi-directional memory element $\overline{w}_{1,1}$ to a low voltage (e.g., $\overline{V_1^{in}}=-V_{prog}$) such that current flows in a second direction (opposite the first direction) from the output line $I_1^{out+}$ to the input line $\overline{V_1^{in}}$ through the second bi-directional memory element $\overline{w}_{1,1}$.

Additionally, in the embodiment illustrated in FIG. 4B, the first bi-directional memory element $w_{2,1}$ in the first column 102 and the second row 103 of the crossbar array 104 may be programmed into a high resistance (R) state by setting both of the output lines $I_1^{out-}$, $I_1^{out+}$ in the first column 102 to a high voltage (e.g., $I_1^{out-}=I_1^{out+}=+V_{prog}$) and then setting the input line $V_2^{in}$ connected to the first bi-directional memory element $w_{2,1}$ to a low voltage (e.g., $V_2^{in}=-V_{prog}$) such that current flows in the second direction from the output line $I_1^{out+}$ to the input line $V_2^{in}$ through the first bi-directional memory element $w_{2,1}$.

Table 3 below depicts the values of the voltages applied to the input lines $V_i^{in}$, $\overline{V_i^{in}}$ and the output lines $I_j^{out-}$, $I_j^{out+}$ to program the state of bi-directional memory elements $w_{2,1}$, $\overline{w}_{1,1}$ in the first column 102 by flowing current through the bi-directional elements $w_{2,1}$, $\overline{w}_{1,1}$ in a direction from the output line $I_1^{out+}$ to the input lines $V_2^{in}$, $\overline{V_1^{in}}$.

TABLE 3

| Line | Value | Effect |
| --- | --- | --- |
| $V_1^{in}$ | $+V_{prog}$ | No current across $w_{1,1}$ |
| $\overline{V_1^{in}}$ | $-V_{prog}$ | Sets bi-directional weight element $\overline{w}_{1,1}$ to a high resistance state (R) |
| $V_2^{in}$ | $-V_{prog}$ | Sets bi-directional weight |

TABLE 3-continued

| Line | Value | Effect |
|---|---|---|
| | | element $w_{2,1}$ to a high resistance state (R) |
| $\overline{V_2^{in}}$ | $+V_{prog}$ | No current across $\overline{w}_{2,1}$ |
| $V_1^{out+}$ | $+V_{prog}$ | Enables writing to bi-directional weight elements $w_{i,1}/_{i,1}$ in the first column that will be programmed into a high resistance state by current flowing in the second direction |
| $V_1^{out-}$ | $+V_{prog}$ | Disables writing to bi-directional weight elements $w_{i,1}/\overline{w}_{i,1}$ in the first column that were programmed into a low resistance state by current flowing in the first direction |
| $V_2^{out+}$ | $-V_{prog}$ | Disables writing to bi-directional weight elements $w_{i,2}/\overline{w}_{i,2}$ in the second column |
| $V_2^{out-}$ | $+V_{prog}$ | Disables writing to bi-directional weight elements $w_{i,2}/\overline{w}_{i,2}$ in the second column |

Figure 4C:
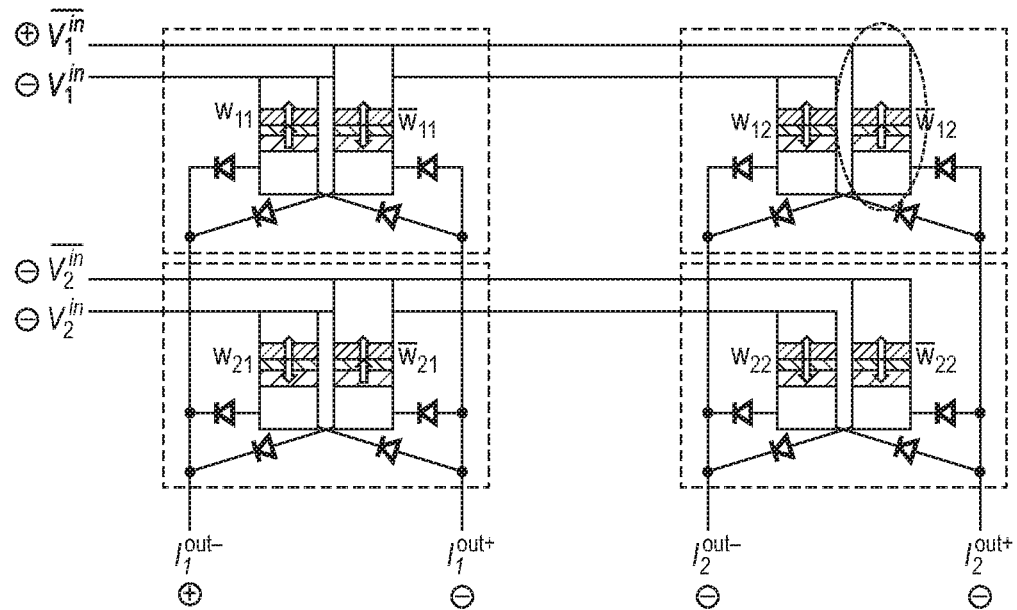
Figure 4D:
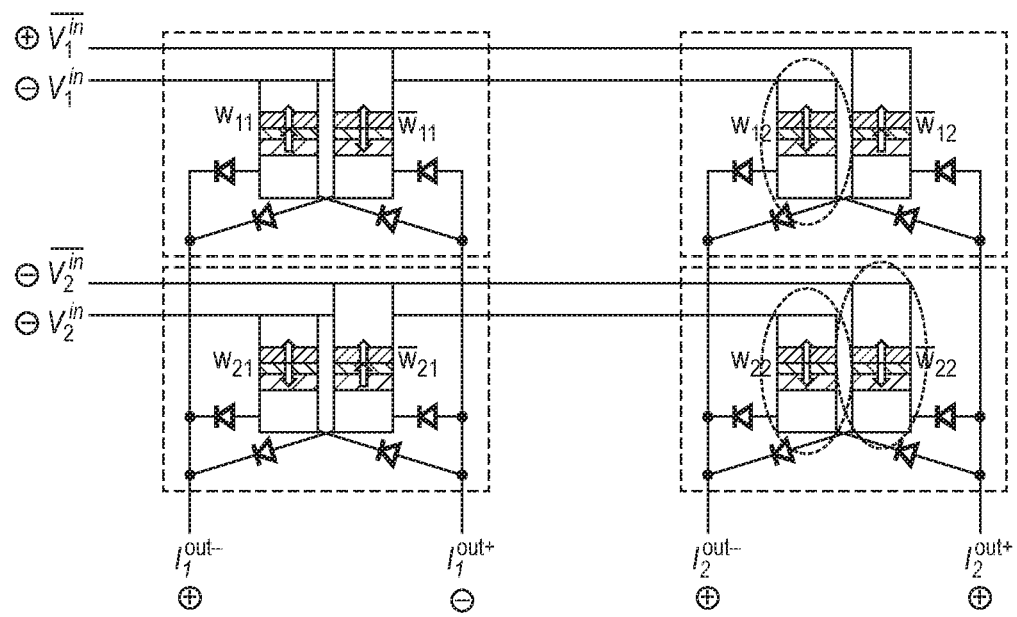

With reference now to FIGS. 4C-4D, the states of the bi-directional memory elements $w_{1,2}$, $\overline{w}_{1,2}$, $w_{2,2}$, $\overline{w}_{2,2}$ of the weight cells 101 in the second column 102 may be programmed by disabling writing for the remaining columns 102 (e.g., the first column 102 and any columns 102 other than the second column 102 of the integrated circuit 100) by placing the output lines $I_j^{out-}$, $I_j^{out+}$ connected to the remaining columns in reverse bias (e.g., setting the first output line $I_1^{out-}$ connected to the first column 102 to $+V_{prog}$ and setting the second output line $I_1^{out+}$ connected to the first column 102 to $-V_{prog}$).

With reference now to FIG. 4C, the second bi-directional memory element $\overline{w}_{1,2}$ in the second column 102 and the first row 103 of the crossbar array 104 may be programmed into a low resistance (r) state by setting both of the output lines $I_2^{out-}$, $I_2^{out+}$ in the second column 102 to a low voltage (e.g., $I_2^{out-}=I_2^{out+}=-V_{prog}$) and then setting the input line $\overline{V}_1^{in}$ connected to the second bi-directional memory element $\overline{w}_{1,2}$ to a high voltage (e.g., $\overline{V}_1^{in}=+V_{prog}$) such that current flows in a first direction from the input line $\overline{V}_1^{in}$ to the output line $I_2^{out-}$ through the second bi-directional memory element $\overline{w}_{1,2}$.

Table 4 below depicts the values of the voltages applied to the input lines $V_i^{in}$, $\overline{V}_i^{in}$ and the output lines $I_j^{out-}$, $I_j^{out+}$ to program the state of bi-directional memory element $\overline{w}_{1,2}$ in the second column 102 by flowing current through the bi-directional element $\overline{w}_{1,2}$ in a direction from the input line $\overline{V}_1^{in}$ to the output line $I_2^{out-}$.

TABLE 4

| Line | Value | Effect |
|---|---|---|
| $V_1^{in}$ | $-V_{prog}$ | No current across $w_{1,2}$ |
| $\overline{V}_1^{in}$ | $+V_{prog}$ | Sets bi-directional weight element $\overline{w}_{1,2}$ to a low resistance state (r) |
| $V_2^{in}$ | $-V_{prog}$ | No current across $w_{2,2}$ |
| $\overline{V}_2^{in}$ | $-V_{prog}$ | No current across $\overline{w}_{2,2}$ |
| $V_1^{out+}$ | $-V_{prog}$ | Disables writing to bi-directional weight elements $w_{i,1}/\overline{w}_{i,2}$ in the first column |
| $V_1^{out-}$ | $+V_{prog}$ | Disables writing to bi-directional weight elements $w_{i,1}/\overline{w}_{i,2}$ in the first column |
| $V_2^{out+}$ | $-V_{prog}$ | Disables writing to bi-directional weight elements $w_{i,2}/\overline{w}_{i,2}$ that will be programmed into a high resistance state by current flowing in the second direction |
| $V_2^{out-}$ | $-V_{prog}$ | Enables writing to bi-directional weight elements $w_{i,2}/\overline{w}_{i,2}$ that will be programmed into a low resistance state by current flowing in the first direction |

With reference now to the embodiment illustrated in FIG. 4D, the remaining bi-directional memory elements in the second column 102 (e.g., the first bi-directional memory element $w_{1,2}$ in the second column 102 and the first row 103 of the crossbar array 104, and the first and second bi-directional memory elements $w_{2,2}$, $\overline{w}_{2,2}$ in the second column 102 and the second row 103 of the crossbar array 104) may be programmed into a high resistance (R) state.

For instance, in the illustrated embodiment, the first bi-directional memory element $w_{1,2}$ in the second column 102 and the first row 103 of the crossbar array 104 may be programmed into the high resistance (R) state by setting both of the output lines $I_2^{out-}$, $I_1^{out+}$ in the second column 102 to a high voltage (e.g., $I_2^{out-}=I_2^{out+}=+V_{prog}$) and then setting the input line $V_1^{in}$ connected to the first bi-directional memory element $w_{1,2}$ to a low voltage (e.g., $V_1^{in}=-V_{prog}$) such that current flows in a second direction (opposite the first direction) from the output line $I_2^{out+}$ to the input line $V_1^{in}$ through the first bi-directional memory element $w_{1,2}$.

Additionally, in the embodiment illustrated in FIG. 4D, the first and second bi-directional memory elements $w_{2,2}$, $\overline{w}_{2,2}$ in the second column 102 and the second row 103 of the crossbar array 104 may be programmed into a high resistance (R) state by setting both of the output lines $I_2^{out-}$, $I_2^{out+}$ in the second column 102 to a high voltage (e.g., $I_2^{out-}=I_2^{out+}=+V_{prog}$) and then setting the input lines $V_2^{in}$, $\overline{V}_2^{in}$ connected to the first and second bi-directional memory elements $w_{2,2}$, $\overline{w}_{2,2}$, respectively, to a low voltage (e.g., $V_2^{in}=\overline{V}_2^{in}=-V_{prog}$) such that current flows in the second direction from the output line $I_2^{out+}$ to the input line $V_2^{in}$ through the first bi-directional memory element $w_{2,2}$ and current flows in the second direction from the output line $I_2^{out+}$ to the input line $\overline{V}_2^{in}$ through the second bi-directional memory element $\overline{w}_{2,2}$.

Table 5 below depicts the values of the voltages applied to the input lines $V_i^{in}$, $\overline{V}_i^{in}$ and the output lines $I_j^{out-}$, $I_j^{out+}$ to program the states of bi-directional memory elements $w_{1,2}$, $w_{2,2}$, $\overline{w}_{1,2}$ in the second column 102 by flowing current through the bi-directional elements $w_{1,2}$, $w_{2,2}$, $\overline{w}_{1,2}$ in a direction from the output line $I_2^{out+}$ to the input lines $V_2^{in}$, $\overline{V}_2^{in}$, $V_1^{in}$.

TABLE 5

| Line | Value | Effect |
|---|---|---|
| $V_1^{in}$ | $-V_{prog}$ | Sets bi-directional weight element $w_{1,2}$ to a high resistance state (R) |
| $\overline{V}_1^{in}$ | $+V_{prog}$ | No current across $\overline{w}_{1,2}$ |

TABLE 5-continued

| Line | Value | Effect |
|---|---|---|
| $V_2^{in}$ | $-V_{prog}$ | Sets bi-directional weight element $w_{2,2}$ to a high resistance state (R) |
| $\overline{V_2^{in}}$ | $-V_{prog}$ | Sets bi-directional weight element $\overline{w}_{2,2}$ to a high resistance state (R) |
| $V_1^{out+}$ | $-V_{prog}$ | Disables writing to bi-directional weight elements $w_{i,1}/\overline{w}_{i,2}$ in the first column |
| $V_1^{out-}$ | $+V_{prog}$ | Disables writing to bi-directional weight elements $w_{i,1}/\overline{w}_{i,2}$ in the first column |
| $V_2^{out+}$ | $+V_{prog}$ | Enables writing to bi-directional weight elements $w_{i,2}/\overline{w}_{i,2}$ that will be programmed into a high resistance state by current flowing in the second direction |
| $V_2^{out-}$ | $+V_{prog}$ | Disables writing to bi-directional weight elements $w_{i,2}/\overline{w}_{i,2}$ that were programmed into a low resistance state by current flowing in the first direction |

The above-described tasks of programming the states of the bi-directional weight elements $w_{i,j}$, $\overline{w}_{i,j}$ may be repeated for each of the columns 102 of the crossbar array 104. It will be appreciated by a person of ordinary skill in art that the bi-directional weight elements $w_{i,j}$, $\overline{w}_{i,j}$ may be programmed into any combination of low resistance states and high resistance states depending on the desired values of the matrix that will be utilized in the MAC operation. In the embodiment illustrated in FIGS. 4A-4D, for each column 102, a portion of the bi-directional memory elements $w_{i,j}$, $\overline{w}_{i,j}$ are first programmed into a first state (e.g., a low resistance state) by current flowing in a first direction from the input lines to the output lines, and then the remaining bi-directional memory elements are subsequently programmed into a second state (e.g., a high resistance state) by current flowing in a second direction from the output lines to the input lines. In one or more embodiments, for each of the columns 102 of the crossbar array 104, a portion of the bi-directional memory elements $w_{i,j}$, $\overline{w}_{i,j}$ may be first programmed into a first state (e.g., a high resistance state) by current flowing in the second direction from the output lines to the input lines, and then the remainder of the bi-directional memory elements $w_{i,j}$, $\overline{w}_{i,j}$ may be subsequently programmed into a second state (e.g., a low resistance state) by current flowing in the first direction from the input lines to the output lines.

What is claimed is:

1. A weight cell, comprising:
   a first bi-directional memory element comprising a first terminal and a second terminal, the first bi-directional memory element configured to switch between a first resistance state and a second resistance state different than the first resistance state;
   a first input line connected to the first terminal;
   a first diode connecting the second terminal to a first output line, the first diode oriented in forward bias from the first bi-directional memory element to the first output line;
   a second bi-directional memory element comprising a first terminal and a second terminal, the second bi-directional memory element configured to switch between the first resistance state and the second resistance state;
   a second input line connected to the first terminal of the second bi-directional memory element;
   a second diode connecting the second terminal of the second bi-directional memory element to a second output line, the second diode oriented in reverse bias from the second bi-directional memory element to the second output line;
   a third diode connecting the second terminal of the first bi-directional memory element to the second output line, the third diode oriented in reverse bias from the first bi-directional memory element to the second output line; and
   a fourth diode connecting the second terminal of the second bi-directional memory element to the first output line, the fourth diode oriented in forward bias from the second bi-directional memory element to the first output line.

2. The weight cell of claim 1, wherein each of the first and second bi-directional memory elements is a magnetic tunnel junction (MTJ) comprising a pinned layer and a free layer.

3. The weight cell of claim 2, wherein the MTJ of each of the first and second bi-directional memory elements has perpendicular magneto anisotropy.

4. The weight cell of claim 3, wherein the first and second bi-directional memory elements are located in a same layer of the weight cell, and magnetizations of pinned layers of the first and second bi-directional memory elements are oriented either up or down.

5. The weight cell of claim 2, wherein the MTJ of each of the first and second bi-directional memory elements has in-plane magneto anisotropy.

6. The weight cell of claim 5, wherein the first and second bi-directional memory elements are located in a same layer of the weight cell, and magnetizations of pinned layers of the first and second bi-directional memory elements are oriented parallel to each other.

7. The weight cell of claim 2, wherein the MTJ of the first bi-directional memory element and the MTJ of the second bi-directional memory element are in different layers of the weight cell.

8. The weight cell of claim 1, wherein each of the first, second, third, and fourth diodes comprises a tantalum layer, a tantalum nitride layer on the tantalum layer, and a tantalum oxy nitride layer on the tantalum nitride layer.

9. The weight cell of claim 1, wherein a ratio of resistance in reverse bias to resistance in forward bias of at least one of the first, second, third, and fourth diodes is approximately $10^6$.

10. An integrated circuit, comprising:
    a plurality of weight cells arranged in a crossbar array having a plurality of columns and a plurality of rows;
    a pair of input lines for each row of the plurality of rows, the pair of input lines comprising a first input line and a second input line; and
    a pair of output lines for each column of the plurality of columns, the pair of output lines comprising a first output line and a second output line,
    wherein each weight cell of the plurality of weight cells comprises:
      a first bi-directional memory element comprising a first terminal and a second terminal, the first bi-directional memory element configured to switch between a first resistance state and a second resistance state different than the first resistance state;
      a second bi-directional memory element comprising a first terminal and a second terminal, the second bi-directional memory element configured to switch between the first resistance state and the second resistance state;

a first diode connecting the second terminal to the first output line of the respective pair of output lines, the first diode oriented in forward bias from the first bi-directional memory element to the first output line;

a second diode connecting the second terminal of the second bi-directional memory element to the second output line of the respective pair of output lines, the second diode oriented in reverse bias from the second bi-directional memory element to the second output line;

a third diode connecting the second terminal of the first bi-directional memory element to the second output line, the third diode oriented in reverse bias from the first bi-directional memory element to the second output line; and a fourth diode connecting the second terminal of the second bi-directional memory element to the first output line, the fourth diode oriented in forward bias from the second bi-directional memory element to the first output line.

11. The integrated circuit of claim 10, wherein the first and second bi-directional memory elements of each of the plurality of weight cells is a magnetic tunnel junction (MTJ) comprising a pinned layer and a free layer.

12. The integrated circuit of claim 11, wherein the MTJ of each of the first and second bi-directional memory elements has perpendicular magneto anisotropy.

13. The integrated circuit of claim 11, wherein the MTJ of each of the first and second bi-directional memory elements has in-plane magneto anisotropy.

14. A method of performing multiply and accumulate operations utilizing the integrated circuit of claim 10, the method comprising:

performing a read operation comprising:
supplying a vector of inputs to each pair of input lines;
holding each pair of output lines at ground; and
calculating a product of the vector of inputs and a matrix of values, wherein the matrix of values are encoded by resistance states of the first and second bi-directional memory elements of each memory cell of the plurality of weight cells.

15. The method of claim 14, wherein the supplying the vector of inputs comprises supplying time-encoded pulses of fixed potentials having opposite signs to the first and second input lines for each pair of input lines.

16. The method of claim 14, wherein the supplying the vector of inputs comprises supplying potential-encoded values to the first and second input lines for each pair of input lines.

17. The method of claim 14, further comprising performing a write operation to program the first and second bi-directional memory elements of each of the plurality of weight cells into a high resistance state or a low resistance state.

18. The method of claim 17, wherein the performing the write operation comprises:

programming the first and second bi-directional memory elements of each of the weight cells in a first column of the plurality of columns into the high resistance state or the low resistance state; and subsequently programming the first and second bi-directional memory elements of each of the weight cells in a second column of the plurality of columns into the high resistance state or the low resistance state.

19. The method of claim 18, wherein the programming the first and second bi-directional memory elements of each of the weight cells in the first column comprises:

disabling writing to the first and second bi-directional memory elements of each of the weight cells in the second column by setting the pair of output lines for the second column in reverse bias.

20. The method of claim 19, wherein the programming the first and second bi-directional elements of each of the weight cells in the first column further comprises:

programming a portion of the first and second bi-directional memory elements of the weight cells in the first column by flowing current in a first direction from the input lines to the output lines; and programming a remaining portion of the first and second bi-directional memory elements of the weight cells in the first column by flowing current in a second direction from the output lines to the input lines.

* * * * *